United States Patent [19]

Henty

[11] Patent Number: 5,079,216
[45] Date of Patent: Jan. 7, 1992

[54] COMPOSITE HIGH TEMPERATURE SUPERCONDUCTOR AND SUBSTRATE STRUCTURE

[76] Inventor: David L. Henty, 650 Town Center Dr., Suite 1930, Costa Mesa, Calif. 92626

[21] Appl. No.: 531,918

[22] Filed: Jun. 1, 1990

Related U.S. Application Data

[62] Division of Ser. No. 93,304, Sep. 4, 1987, Pat. No. 4,931,424.

[51] Int. Cl.$^5$ .................. H01B 12/00; H01L 27/12
[52] U.S. Cl. .................................. 505/1; 357/4; 357/5; 427/62
[58] Field of Search .............. 427/62, 63; 357/5; 505/1

[56] References Cited

U.S. PATENT DOCUMENTS 4,826,808  5/1989  Yurek et al. .................. 427/62

OTHER PUBLICATIONS

"Preparation and Substrate Reactions of Superconducting Y-Ba-Cu-O Films", Gurvitch et al., Appl. Phys. Lett., vol. 51, #13, Sep. 28, 1987, pp. 1027–1029.
"Preparation of $YBa_2Cu_3O_{7-x}$ Superconducting Thin Films by RF-Magnetron Sputtering", Aida et al., Jap. J. Appl. Phys., vol. 20, #9, Sep. 1987, pp. L1489–L1491.
"Effect of Noble Metal Buffer Layer on Superconducting $YBa_2Cu_3O_7$ Thin Films", Chien et al., Appl. Phys. Lett., vol. 51, #25, Dec. 21, 1987, pp. 2155–2157.
"Preparation and Characterization of Superconducting Y-Ba-Cu-O Thin Films", Adachi et al., Jap. J. Appl. Phys., vol. 26, #5, May 1987, pp. L709–L710.
"Quantum Interference Devices Made from Super–Conducting Oxide Thin Films", Koch et al., Appl. Phys. Lett., vol. 51, #3, Jul. 1987, pp. 200–202.
"Some Problems in the Preparation of Superconducting Oxide films on Ceramic Substrates", Koinuma et al., Jap. J. Appl. Phys., vol. 26, #5, May 1987, pp. L763–L765.

*Primary Examiner*—Rolf Hille
*Assistant Examiner*—Mahshid Saadat

[57] ABSTRACT

A composite high temperature superconductor and substrate structure formed by a process which employs masking a substrate slab into regions to have superconductor devices therein, depositing superconductor ceramic compound materials within said regions, masking the substrate slab upper surface outside of the regions with reflective material, and heating the superconductor material to a temperature desired for firing or sintering the material. The semiconductor slab outside of the superconducting region is maintained at a relatively low temperature by reflection of the incident energy by the reflective material. After heating of the superconducting material to its ceramic form, the reflective material is removed and the remainder of the semiconductive circuit is processed in a conventional manner.

9 Claims, 2 Drawing Sheets

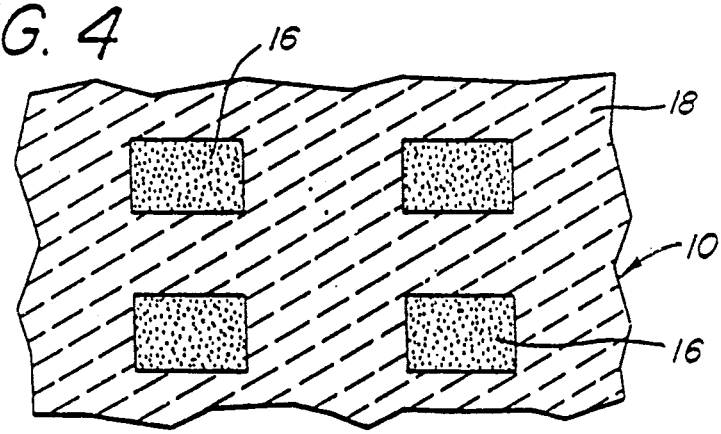
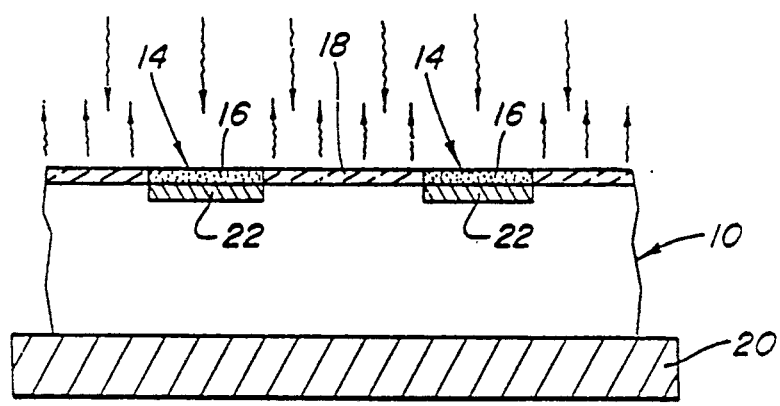
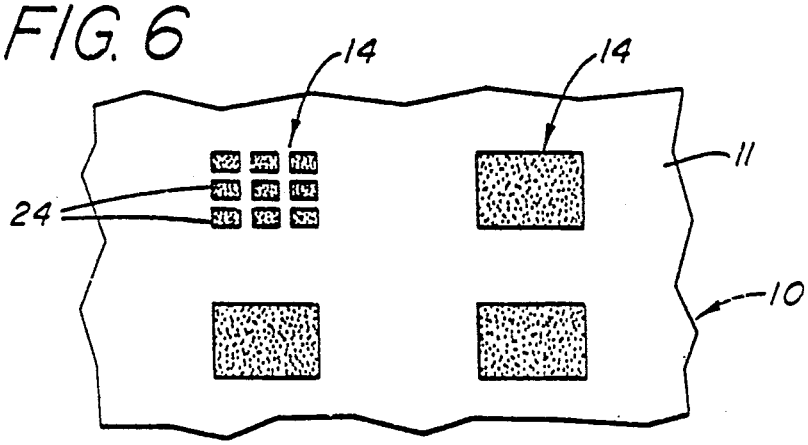

COMPOSITE HIGH TEMPERATURE SUPERCONDUCTOR AND SUBSTRATE STRUCTURE

This is a division of application Ser. No. 093,304, filed on Sept. 4, 1987, now U.S. Pat. No. 4,931,424.

BACKGROUND OF THE INVENTION

1. Field of the Invention

The present invention relates to processing of high temperature superconductor ceramic materials and processing of semiconductor integrated circuits.

2. Background of the Related Art

Achievement of superconductivity at high temperature, i.e. temperatures greater than that of liquid nitrogen, is of tremendous technological importance. The number of potential applications for such high temperature superconductors are clearly enormous. Therefore, the announcement of superconductivity at approximately 30 K by Bednorz and Muller, Z. Phys. B. 64, 189 (1986) in certain lanthanum barium cupric oxide ceramic materials has generated unprecedented excitement and efforts in the scientific, technological and business communities. Following the announcement of the work of Bednorz and Muller, these efforts have generated several significant and rapid increases in the superconductivity onset temperatures. Chu and others have reported superconductivity over 90° K. in yttrium barium cupric oxide ceramic compounds. M.K. Wu, J.R. Ashburn, C.J. Torng, P.H. Hor, R.L. Meng, L. Gao, C.J. Huang, Y.Q. Wang, and C.W. Chu, Phys. Rev. Lett. 58, 908 (1987), C.W. Chu, P.H. Hor, R.L. Meng, L. Gao, Z.J. Huang and Y.Q. Wang, Phys. Rev. Lett. 58, 408 (1987). More recently, superconductivity at 155 K with evidence of superconductivity onset above room temperature has been reported S.R. Ovshinsky, R.T. Young, D.D. Allred, G. DeMaggio, G.A. Van der Leeden, Phys. Rev. Lett. 58, 2579 (1987). The latter result involved a multiphase ceramic material of yttrium, barium, copper, fluorine and oxygen.

A significant problem associated with forming circuits from the new high temperature superconductors, however, is the high processing temperature required for forming the superconducting ceramic materials, typically in the range of 700° to 1000° C. These temperatures are higher than can be withstood by silicon or gallium arsenide materials used as part of hybrid semiconductor/superconductor circuits. Therefore, to form a hybrid semiconductor/superconductor circuit, temperatures should be maintained below 450° C. to avoid breakdown of the silicon employed in such a silicon/superconductor hybrid circuit. However, this temperature is too low for formation of superconductor layers on the silicon since these would require temperatures in the 900° to 1000° C. range.

Another problem related to the processing of hybrid semiconductor/superconductor circuits, using conventional semiconductor processing techniques, is the tendency of the high temperature ceramic superconductors to lose oxygen in a vacuum environment and thereby lose superconducting properties. For this reason, conventional vacuum deposition techniques cannot be employed for depositing the ceramic superconductor materials onto a semiconductor substrate in a conventional manner.

For the foregoing reasons, a strong need presently exists for a method for forming hybrid semiconductor/superconductor circuits using some or all of the already highly developed semiconductor processing technology.

SUMMARY OF THE INVENTION

The present invention provides a composite high temperature superconductor and substrate structure employing a substrate of silicon, gallium arsenide or other suitable semiconductive material. A masking step is employed to outline blocks on the surface of the semiconductor slab in which the superconductor material is desired for circuit formation. The size of the blocks and the number of such blocks will vary with the particular hybrid semiconductor/superconductor circuit. The superconducting material is deposited in the exposed blocks by conventional vacuum deposition techniques, however, in an unfired form. Therefore, the constituent compounds of the superconductor will be deposited in an appropriate cation ratio for the desired superconductor. For example, a Y-Ba-Cu-0 compound or Y-Ba-Cu-F-0 compound could be employed. The superconductor outlining mask is then removed and a mask layer of a good reflector of microwave or infrared energy is laid down on the areas of the substrate surface other than the blocks of superconducting material. One such reflective material for example could be aluminum. The surface of the substrate slab is then exposed to microwave or infrared radiation, depending on the specific application and materials, with the slab maintained in an oxygen atmosphere. The frequency of the radiation is chosen to provide sufficient coupling to the superconducting material and sufficient resolution to give the desired block size. Thus, for example, where submillimeter blocks of superconducting material are desired in the hybrid circuit, infrared radiation will be needed since the block size must exceed the wavelength of the incident radiation to provide coupling to the superconducting material in the blocks. The heating of the superconducting material by the incident infrared or microwave radiation is maintained in the oxygen atmosphere until the superconducting material has been fired with a suitable oxygen abundance to provide superconducting properties. The semiconductor slab may be cooled from below to prevent heating of the semiconductor material to a temperature which would result in breakdown of the properties of the semiconductor material, due to conduction from the superconducting material. Following the microwave or infrared heating step, the reflective mask layer is removed and the blocks of superconductor are etched in a form desired for the specific circuit application. Following the etching, the superconductive material is covered with a protective material to prevent loss of the oxygen content while further processing of the remainder of the semiconductor substrate slab proceeds in the conventional manner.

In an alternate embodiment, the superconductive material is deposited within the masked blocks in a fired and ground form without employing vacuum deposition of such material. The superconductive material is preferably ground into an ultrafine powder, mixed with a binder and applied to the substrate within the blocks using thick film techniques. The superconductive material is then sintered using microwave or infrared energy in an appropriate oxygen atmosphere. The remainder of the processing steps are as in the case of firing of the material directly on the substrate slab.

DESCRIPTION OF THE DRAWINGS

FIG. 4 is a top view of the substrate slab showing a reflective mask layer covering the areas of the top surface of the substrate slab outside the blocks.

FIG. 5 is a side view showing the incident microwave or infrared energy being selectively absorbed by the superconducting material.

FIG. 6 is a top view of the substrate slab with superconductive material etched within a block.

DESCRIPTION OF THE PREFERRED EMBODIMENT

Figure 1:
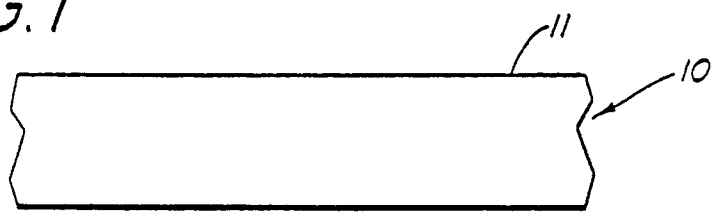
FIG. 1 is a cross-sectional view of a conventional substrate slab of silicon or other suitable semiconductor material on which a hybrid semiconductor/superconductor circuit may be formed.

Referring to FIG. 1, a semiconductor substrate slab 10 is shown in cross-section. For the discussion of the preferred embodiment herein, the substrate slab 10 will be taken to be a silicon substrate. The silicon substrate 10 may optionally have an epitaxial layer doped n or p type, or the entire substrate slab may be doped n or p type silicon The substrate slab 10 has a planar upper surface 11 on which a hybrid semiconductor/superconductor circuit may be formed.

Figure 2:
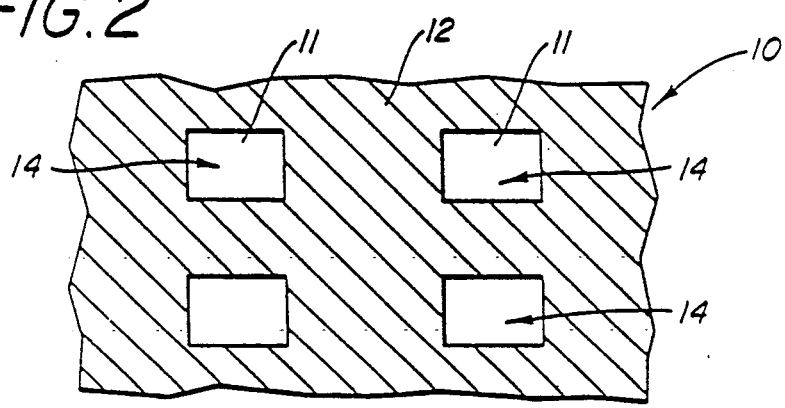
FIG. 2 is a top view of the substrate slab of FIG. 1 showing blocks outlined by a mask step for depositing of superconductor material.

Referring to FIG. 2, a top view of the semiconductor substrate slab 10 is shown. A masking step is employed to form a masking layer 12 which outlines blocks 14 of exposed semiconductor surface 11. The blocks 14 correspond to portions of the surface 11 of the semiconductor substrate slab 10 which will incorporate superconductors as part of the hybrid semiconductor/superconductor circuit to be formed. One example of such a hybrid semiconductor/superconductor circuit could employ superconductor material to form Josephson junctions as part of a superconducting quantum interference device (SQUID). In such an application the SQUIDs could be formed in region 14, or as an array in several regions 14, with the electronics employed with the SQUID being of a conventional semiconductor type formed in the remainder of the surface 11 of the substrate slab 10. Various other applications are also possible, for example employing Josephson junction switches or other applications employing superconducting devices formed in regions 14.

The number of regions 14 and their size will depend on the specific circuit and application, and are only limited in size and arrangement on the surface 11 of substrate slab 10 by the requirement that they couple with incident electromagnetic energy, in a manner to be described below, and hence have a size equal to or greater than the wavelength of the incident electromagnetic energy. Where the wavelength of the electromagnetic radiation is relatively small, for example, infrared frequency energy, and the device size of the devices incorporating the superconductors is relatively large in relation to such wavelength, the mask 12 may be chosen to outline the superconductor portion of the device directly in regions 14 rather than rectangular blocks as indicated.

Figure 3A:
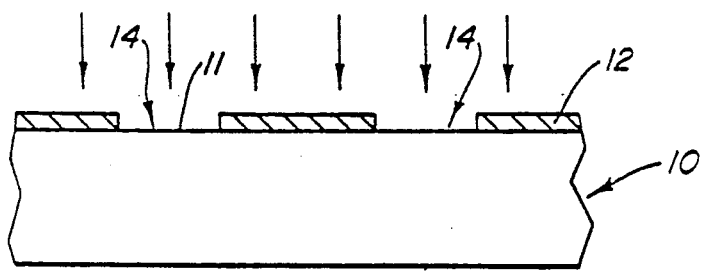
FIG. 3(a) is a side view and FIG. 3(b) is a top view therefor of the substrate slab showing superconducting component materials being deposited on the substrate slab in the areas outlined by the blocks.
Figure 3B:
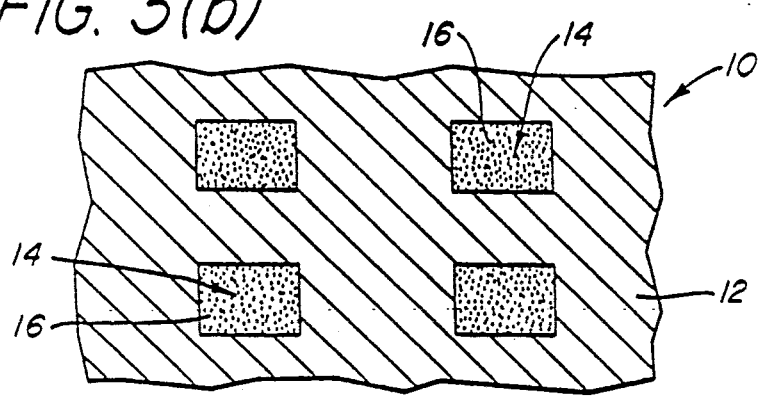

Referring to FIGS. 3(a) and 3(b) the deposition of the compounds for formation of the superconducting material is illustrated. In FIG. 3(a), the compounds forming the superconducting material are shown being deposited on the top surface 11 of the semiconductor substrate 10. The compounds may be deposited using conventional vacuum deposition techniques, or other suitable deposition techniques. The compounds should be deposited in the appropriate cation ratios on the surface 11 of substrate slab 10 in the regions 14. For example, if a Y-Ba-Cu-0 superconductor is desired, the compounds Y, Ba and Cu should be deposited in regions 14, in a manner such as described in P. Chaudhari, et al., *Phys. Rev. Lett.* 58, 2684 (1987) and R.B. Laibowitz, et al., *Phys. Rev. B.* 35, 8821 (1987), the disclosures of which are incorporated herein by reference. Similarly, for other high temperature superconducting materials, such as Y-Ba-Cu-F-0, La-Ba-Cu-0, the appropriate compounds should be deposited in the desired cation ratio. A wide range of other deposition techniques may be employed however to provide a thin film of the superconductor constituent compounds on surface 11 within regions 14. In FIG. 3(b), the deposited superconducting constituent material 16 is shown deposited within regions 14. In an optional embodiment, prior to the deposition step illustrated in FIG. 3(a), the top surface 11 of substrate slab 10 within regions 14 may be provided with a thermal insulating layer For example, a $SiO_2$ layer may be grown on the surface 11 in regions 14 by conventional methods.

Following the deposition of the superconducting constituent compounds 16 in regions 14, the mask layer 12 is removed and a second mask layer 18 is provided over the exposed regions of the top surface 11 of substrate slab 10, as shown in FIG. 4. The mask layer 18 is a reflective material chosen to reflect electromagnetic energy in the wavelength to be used to heat the superconducting constituent material 16. One example of such a reflective material suitable for a wide range frequencies is aluminum. Many other reflective materials may also be employed, however, depending on the frequency applied.

Referring to FIG. 5, heating of the superconductor material is shown schematically with the substrate slab 10 shown in cross-section and the incident electromagnetic energy shown applied from above. For applications with relatively few superconducting devices or with a few relatively large regions 14 suitable for the specific circuit design, microwave frequency energy may be applied to heat the superconductor material 16. In an application where the circuit requirements are better served by a plurality of regions 14, infrared energy is preferably applied to heat the superconductor material 16. In this case, the size of the regions 14, or the specific devices outlined by regions 14, could be chosen down to a size on the order of the wavelength of the infrared energy. Such infrared energy may be supplied by an infrared laser, high power infrared lamp or other suitable source of infrared energy with power sufficient to heat the material 16 to the desired temperature range of 700° to 1000° C. The frequency of such infrared energy should be chosen to provide sufficient coupling to the superconducting material and, optionally, minimal coupling to the semiconductor substrate material. The reflective material 18 will reflect the incident energy on the regions of the surface of the substrate slab other than regions 14. These areas will thus be kept relatively cool while regions 14 and the superconducting material therein are heated to a desired temperature to allow the firing of the material 16. The heating of the material by the incident electromagnetic energy is preferably done in an oxygen atmosphere to allow the formation of the desired superconducting phase of the ceramic to form. In an alternate embodiment, however, involving larger size regions 14, the superconducting material may be deposited in a fired and ground form with the incident infrared or microwave energy employed to sinter the fired and ground material into a film of the superconducting ceramic material. In such an embodiment, however, the conventional vacuum deposition techniques described in relation to FIG. 3(a) may not readily be employed. Thick film deposition rather than a vacuum deposition is preferably employed coupled with ultrafine grinding of the fired ceramic superconductor material to ensure that the largest grains are much smaller than the size of regions 14 and preferably of micron or submicron size. The grains of the ground superconductor material may then be mixed with a binder such as known organic binders, and applied to regions 14 using thick film techniques. With sufficient fine grains, this can allow even deposition of the grains in the regions 14 on the semiconductor substrate surface 11 in a relatively thin film.

The microwave or infrared heating of the superconductor material as illustrated in FIG. 5 may employ the teachings of co-pending application Pat. No. 074,896 filed July 17, 1987, for a Method For Phase Purification Of High Temperature Superconductors, to the inventor herein, the disclosure of which is incorporated herein by reference. Such preferential choice of incident electromagnetic energy and/or use of polarized incident energy may thus provide the improved characteristics of the ceramic superconductor material in the hybrid semiconductor/superconductor circuit of the present invention. In this regard, it should be appreciated that the teachings of the application Pat. Ser. No. 074,896 may be applied to incident infrared energy as well as microwave energy in the present application in view of the thin film nature of the material being fired or sintered by the energy. Also, strong preferential absorption has been noted in the infrared region in Y-Ba-Cu-0 materials as reported in Kamaras et al., *Phys. Rev. Lett.* 59, 919 (1987). As reported in Kamaras et al., enhanced absorption of infrared frequency energy is found in the non-superconducting phase of $YBa_2Cu_3O_{7-y}$ at a frequency of $3,000-cm^{-1}$ ($0.37-eV$). Thus, preferential heating of desired and undesired phases of the superconductor materials, and/or application of polarized energy may optionally be employed in the infrared region to improve the characteristics of the superconducting materials in the hybrid semiconductor/superconductor circuit of the present invention.

The heating step illustrated in FIG. 5, may also be combined with a lower temperature heat sink at the bottom of substrate slab 10 in order to prevent heating of the semiconductor material below regions 18 and by thermal conduction from regions 14 over long periods of heating. This is illustrated by heat sink 20 shown schematically in FIG. 5. This heat sink 20 will also reduce any damage to the semiconductor material directly below superconductor material 16 in regions 14. This cooling of the semiconductor slab 10 may also be combined with thermally insulating layers directly below regions 14, illustrated generally as regions 22 in FIG. 5.

After the heating of the superconducting material as illustrated in FIG. 5, the reflective mask layer 18 is removed and the blocks 14 of superconductor material are masked and etched to the desired form for the specific superconductor devices to be formed within regions 14. The etching of regions 14 into device size regions is illustrated schematically in FIG. 6 by smaller regions of superconductor material 24 shown within region 14. The etching of the regions 14 may be accomplished by various techniques such as dry etching as described for example in Michael F. Leahy, *Superfine IC Geometries,* IEEE Spectrum (February, 1985) 36, the disclosure of which is incorporated herein by reference.

The remainder of the hybrid semiconductor/superconductor circuit may be formed in an essentially conventional manner. For the remaining steps, however, and any vacuum deposition steps required in formation of the circuit, the surface of the superconductor material in regions 14 should preferably be covered with a protective layer to prevent loss of oxygen and loss of superconducting properties of the material. Also, the regions of semiconductor material under such superconductors in regions 14 may have insufficient quality due to the heating of the superconductors to form direct junctions with the superconductor in which case an additional formation of silicon directly on the superconductor material or adjacent thereto may be required. Such growth of an additional layer of silicon must be done with care to prevent loss of oxygen from the superconductor material.

It will be appreciated by those skilled in the art that the foregoing description of the preferred embodiment has many variations possible while remaining within the scope of the present invention. In particular, the present invention is applicable to a wide variety of specific superconducting compounds and a wide variety of specific circuit configurations and types. Similarly, the various steps may be modified while remaining in the present invention. For example, the mask layer 12 employed for deposition of the superconductor material may be combined with mask 18, or, may extend across the top surface of substrate 10 to provide a reflective layer under the superconducting material and thereby enhance heating from below. Also, the substrate slab 10 may be replaced with an insulator, such as sapphire, and the semiconductor material grown on the insulating slab by conventional techniques.

I claim:

1. A composite structure including a film of high temperature ceramic superconductor material and a substrate having an upper major surface and one or more semiconductor devices formed therein, formed by a process comprising the steps of:

depositing the superconductor material on the upper major surface of said substrate to form a thin layer;

depositing a reflective layer on said upper surface of said substrate;

wherein at least a portion of said layer of superconductor material and said reflective layer are nonoverlapping, and a portion of said layer of superconductor material is exposed; and annealing said superconductor material by application of radiant energy to the upper surface of said substrate.

2. A composite structure as set out in claim 1, wherein said process by which the structure is formed further includes the step of providing a heat sink thermally coupled to the bottom of said substrate prior to said annealing step.

3. A composite structure as set out in claim 1, wherein said composite structure further comprises a layer of thermal insulating material having a relatively low thermal conductivity formed between said superconductor material and said substrate.

4. A composite structure as set out in claim 1, wherein said superconductor material is composed of Y-Ba-Cu-O.

5. A composite structure as set out in claim 1, wherein said substrate includes a layer of $SiO_2$.

6. A composite high temperature superconductor/substrate structure, comprising:
   a substrate having an upper major surface;
   one or more semiconductor devices formed on said upper major surface of said substrate;
   a layer of insulator material formed on said upper major surface of said substrate;
   a layer of high temperature superconductor material formed on said layer of insulator material; and
   a layer of reflective material formed on said insulator material and at least partially underlying said layer of superconductor material.

7. A composite structure as set out in claim 6, wherein said high temperature ceramic superconductor material is composed of Y-Ba-Cu-O.

8. A composite high temperature superconductor/substrate, comprising:
   a substrate having an upper major surface;
   a layer of thermal insulator material having a relatively low thermal conductivity formed on the upper major surface of said substrate;
   a layer of reflective material formed on said layer of thermal insulator material; and
   a high temperature ceramic superconductor material formed on said layer of reflective material.

9. A composite structure as set out in claim 8, wherein said high temperature superconductor material is composed of Y-Ba-Cu-O.

* * * * *